United States Patent [19]
Schoenthaler

[11] Patent Number: 5,162,613
[45] Date of Patent: Nov. 10, 1992

[54] INTEGRATED CIRCUIT INTERCONNECTION TECHNIQUE

[75] Inventor: David Schoenthaler, Yardley, Pa.

[73] Assignee: AT&T Bell Laboratories, Murray Hill, N.J.

[21] Appl. No.: 724,080

[22] Filed: Jul. 1, 1991

[51] Int. Cl.$^5$ .............................................. H01R 9/09
[52] U.S. Cl. .................................. 174/88 R; 29/832; 174/94 R; 174/260; 439/66
[58] Field of Search .............. 174/88 R, 94 R, 260; 439/66, 91; 29/832, 834

[56] References Cited

U.S. PATENT DOCUMENTS

| | | | |
|---|---|---|---|
| 4,113,981 | 9/1978 | Fujita et al. | 174/88 R |
| 4,433,887 | 2/1984 | Sado et al. | 339/17 R |
| 4,548,862 | 10/1985 | Hartman | 428/323 |
| 4,554,033 | 11/1985 | Dery et al. | 174/88 R X |
| 4,588,456 | 5/1986 | Dery et al. | 174/88 R X |
| 4,640,981 | 2/1987 | Dery et al. | 174/88 R |
| 4,642,421 | 2/1987 | Dery et al. | 174/88 R |
| 4,659,872 | 4/1987 | Dery et al. | 174/117 A |
| 4,729,809 | 3/1988 | Dery et al. | 174/88 R X |
| 4,731,282 | 3/1988 | Tsukagoshi et al. | 428/220 |
| 4,735,847 | 4/1988 | Fujiwara et al. | 428/209 |
| 4,737,112 | 4/1988 | Jin et al. | 439/66 |
| 4,740,657 | 4/1988 | Tsukagoshi et al. | 174/88 |
| 4,808,112 | 2/1989 | Wood et al. | 439/66 |
| 4,814,040 | 3/1989 | Ozawa | 439/91 |
| 4,818,607 | 4/1989 | Rickborn et al. | 428/323 |
| 4,820,376 | 4/1989 | Lambert et al. | 156/643 |
| 4,864,471 | 9/1989 | Hargasser et al. | 29/832 X |
| 5,019,944 | 5/1991 | Ishii et al. | 174/260 X |
| 5,046,953 | 9/1991 | Shreeve et al. | 174/260 X |
| 5,049,085 | 9/1991 | Reylek et al. | 439/91 |

FOREIGN PATENT DOCUMENTS

| | | | |
|---|---|---|---|
| 109209 | 4/1990 | Japan | 174/88 R |
| 8602033 | 1/1986 | United Kingdom . | |

*Primary Examiner*—Morris H. Nimmo
*Attorney, Agent, or Firm*—Robert B. Levy

[57] ABSTRACT

Interconnection of each of a plurality of bond sites (14) on a semiconductor chip (10) to a corresponding one of a plurality of metallized areas (16) on a substrate (12) is accomplished via a sheet of anisotropically conductive material (18) sandwiched therebetween. The anisotropically conductive material advantageously has a cutout (24) therein located to expose at least a portion of the substrate lying between a pair of metallized areas (16). The cutout (24) serves to confine a quantity of adhesive (26) deposited therein which serves to secure the chip to the substrate without any physical bond between the metallized areas and the bond sites on the chip while maintaining the anisotropically conductive material in compression.

9 Claims, 1 Drawing Sheet

INTEGRATED CIRCUIT INTERCONNECTION TECHNIQUE

TECHNICAL FIELD

This invention relates to a technique for electrically connecting an integrated circuit chip to a substrate such that the chip can be removed without damaging the substrate.

BACKGROUND OF THE INVENTION

There has been a definite shift by electronics manufacturers toward fabricating products by mounting individual, unpackaged, integrated circuit chips directly to a substrate, e.g., a circuit board. This type of fabrication, referred to as "chip-on-board" assembly, allows for reduced costs since the expense of packaging each chip in a plastic or ceramic package prior to attachment is avoided. Further, chip-on-board assembly allows for a greater density of circuits on a given size circuit board, which is also advantageous.

Currently, individual semiconductor chips are electrically connected to a substrate by first applying a quantity of solder (e.g., a solder "bump") to each of a plurality of contacts on the upper surface of the chip. The chip is then inverted and placed on the substrate so that each solder bump is in aligned contact with a corresponding metallized area on the substrate. Thereafter, the solder bumps are reflowed to achieve a solder bond between the chip and the substrate. Attachment of a chip to the substrate in this manner is known as "flip-chip" bonding. As an alternative to flip-chip bonding, each bond site on the chip may be wire-bonded to a corresponding metallized area on the substrate. Chips may also be connected by using an intermediate tape circuit bonded to both the chip and to the circuit board. This type of bonding is known as "Tape Automated Bonding" (TAB).

Flip-chip, TAB, and wire bonding incur the disadvantage that repairs to the substrate following component attachment cannot be made easily. Removal of a defective chip previously bonded to the substrate often results in damage to the metallized areas on the substrate to which the chip was previously bonded. Repair and/or refurbishing of the metallized areas is often difficult, if not impossible, due to their fragile nature and their close spacing (i.e., fine pitch). As a consequence, chip replacement is generally not practical, resulting in significant scrap costs.

Attempts have been made to solve the repair problem by connecting each chip to the substrate via a slab of anisotropically conductive material sandwiched between the chip and the substrate. The anisotropically conductive material provides electrically conductive paths in the z direction between individual contacts on the chip and corresponding metallized areas on the substrate while providing sufficient impedance in the lateral direction between adjacent paths. Heretofore, the disadvantage associated with the use of anisotropically conductive polymer materials is that some type of fixture has been required to secure the chip and the anisotropically conductive material to the substrate, which adds to the cost and complexity of the fabrication process. It is possible to alleviate the need for a fixture by using an adhesive-type anisotropically conductive material. However, the use of an adhesive-type, anisotropically conductive material would likely give rise to an adhesive residue on the metallized areas on the substrate following removal of the material to replace a defective chip, the same type of problem incurred by conventional chip attachment techniques.

Thus, there is a need for an inexpensive and simple technique for interconnecting an integrated circuit chip to a substrate, while facilitating replacement of a defective chip without damage to the substrate.

SUMMARY OF THE INVENTION

Briefly, in accordance with the invention, a technique is disclosed for connecting a chip to metallized areas on a substrate, while permitting replacement of the chip should it become defective, without damaging the substrate. To accomplish such a connection of a chip to the substrate, a layer of a non-adhesive, anisotropically conductive polymer material having a opening therethrough, is placed on the substrate to overlie each of the metallized areas thereon. Following placement of the anisotropically conductive polymer material on the substrate in this manner, the opening in the material, which is located so as to lie between a pair of metallized areas, is filled with an adhesive. Thereafter, the chip is placed on the anisotropically conductive polymer material to overlie the adhesive-filled opening therein, so that each chip bond site is in aligned registration with a corresponding metallized area on the substrate so as to be electrically connected with the metallized area through the anisotropically conductive polymer material sandwiched between the chip and the substrate. The adhesive serves to secure the chip to the substrate while maintaining the anisotropically conductive material in compression. Should the chip ever become defective, the chip may be removed by shearing the adhesive bond securing it to the substrate without any damage to the metallized areas on the substrate lying below the layer of anisotropically conductive polymer material. This attachment technique may also be practiced with packaged chips having leads or contacts thereon as well as unpackaged chips as described.

DETAILED DESCRIPTION

Figure 1:
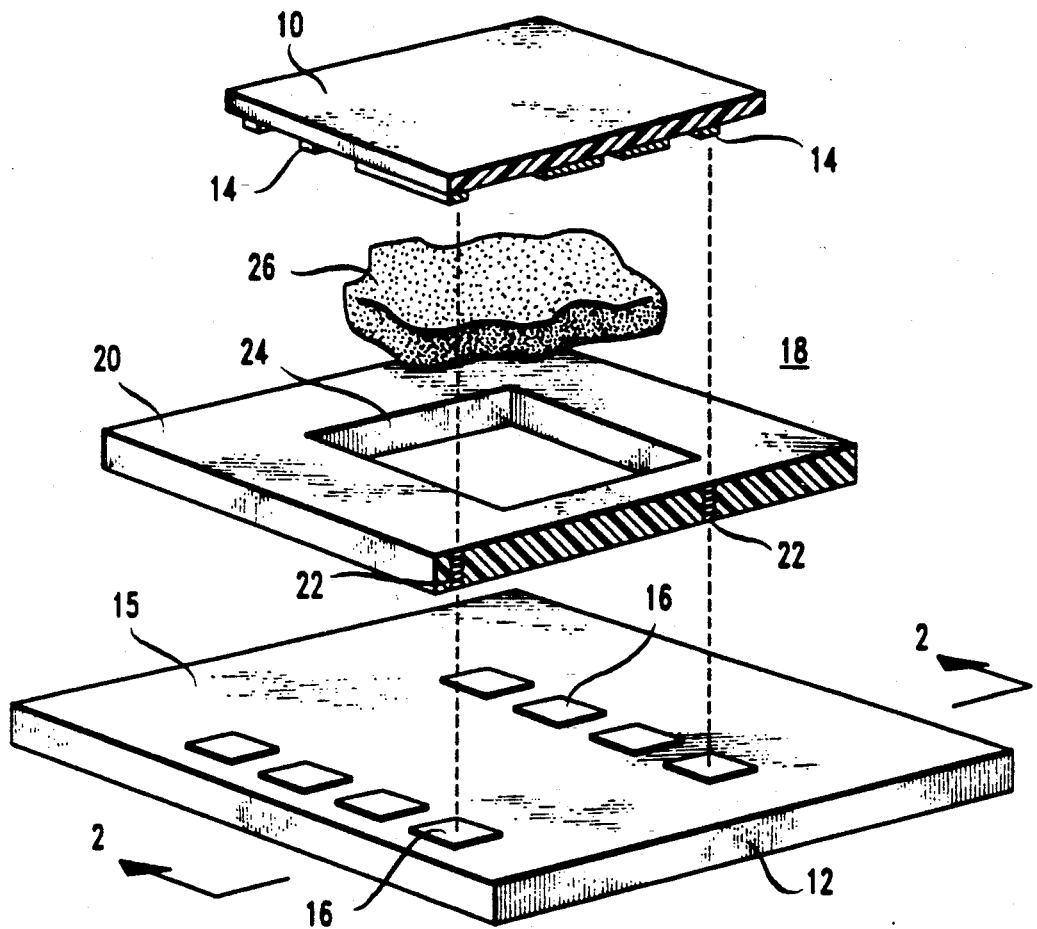
FIG. 1 is an exploded view of an integrated circuit chip and a substrate showing how the chip is attached thereto in accordance with the invention.
Figure 2:
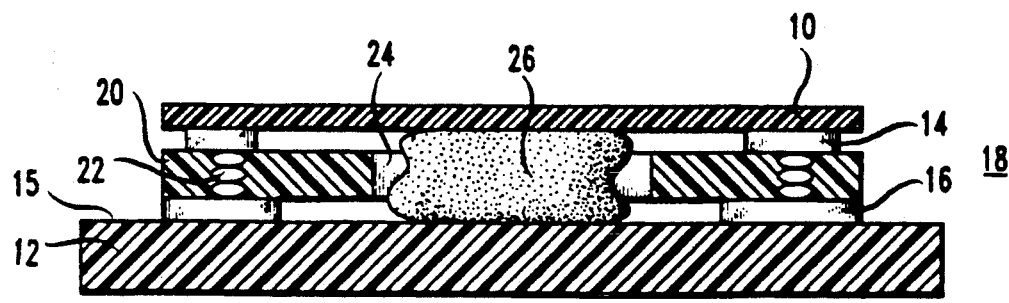
FIG. 2 is a side view of the chip and substrate of FIG. 1 taken along the plane 2—2 thereof.

FIG. 1 is an exploded view and FIG. 2 is a side view, respectively, of an integrated circuit chip 10, and a substrate 12, showing how the chip is connected to the substrate in accordance with the present invention. The integrated circuit chip 10 comprises a relatively thin slab of semiconductive material (e.g., silicon), cut from a wafer (not shown) which has been processed in a conventional manner to yield an integrated circuit. On the chip 10 is a plurality of bond sites or contacts 14 through which power is supplied and through which signals are communicated. The bond sites 14 are normally present on the upper surface of the chip 10, but in FIGS. 1 and 2, the chip is shown inverted and therefore the bond sites appear on the lower surface.

The substrate 12 typically takes the form of a conventional circuit board, made from FR-4 or polyester. Alternatively, the substrate 12 can be made from a ceramic or a polymer thick-film material. On at least one major surface 15 of the substrate 12 is a plurality of metallized areas 16 which are arranged in a pattern corresponding to that of the bond sites 14 on the chip 10. In the case where the substrate 12 is comprised of a conventional circuit board, the metallized areas 16 are established by cladding the surface 15 with a layer of metal such as copper or the like, and then patterning the metal layer by photolithographic techniques. In the case where the substrate 12 is formed of a ceramic or a polymer thick-film material, the metallized areas 16 may be established by depositing a conductive paste or ink on the surface 15.

In the preferred embodiment best illustrated in FIG. 1, the metallized areas 16 are arranged in a two spaced-apart rows, corresponding to the spaced-apart rows of the bond sites 14 on the chip 10. In practice, the substrate 12 will carry a large number of individual patterns of metallized areas 16, each pattern corresponding to a pattern of bond sites 14 on a separate one of a plurality of chips 10. Metallized conductive paths (not shown) are provided for selectively interconnecting the metallized areas 16. Depending on the nature and construction of the substrate 12, these connecting paths may be provided on the surface 15 or on individual layers of the substrate when configured with multiple layers.

As thus far described, the chip 10 and the substrate 12 are of conventional construction.

The bond sites 14 on the chip 10 are each electrically connected to a corresponding one of the metallized areas 16 on the substrate 12 through a sheet of anisotropically conductive material 18. The anisotropically conductive material 18 is comprised of a elastomer matrix 20, typically silicone rubber or the like, which is both non-conductive and which does not react with, or adhere to, the metallized areas 16. Within the matrix 20 is a plurality of conductive particles 22, typically flakes or spheres or wires, arranged in chains extending in the z axis to provide a plurality of laterally spaced electrical conductors extending between each of the opposed major surfaces of the matrix. When the anisotropically conductive material 18 is sandwiched between the chip 10 and the substrate 12 as best shown in FIG. 2, the chains of particles 22 provide low-resistance conductive paths between the bond sites 14 on the chip 10 and the metallized areas 16 on the substrate. The matrix 20, which is itself non-conductive, serves to provide a very high lateral impedance between adjacent chains of particles 22.

To insure that the chains of particles 22 in the matrix 20 of the anisotropically conductive material 18 provide a reliable connection between the bond sites 14 and the metallized areas 16, it is desirable that the material 18 be compressed. Heretofore, such compression has been obtained by the use of a mechanical fixture (not shown), the use of such fixtures increasing both the cost and complexity of fabrication. In accordance with the invention, the chip 10 is adhesively secured to the substrate 12 to compress the anisotropically conductive material 18, thereby obviating the need for such a fixture.

Referring to FIG. 1, to facilitate such attachment of the chip 10 to the substrate 12, at least one cutout 24 is provided within the anisotropically conductive material 18 located such that when the material is placed on the substrate, the cutout exposes a portion of the substrate lying between a pair of metallized areas 16. In the illustrated preferred embodiment, a single, centrally located cutout 24 is provided within the anisotropic material 18 so as to expose a portion of the substrate lying between the two rows of metallized areas 16. The cutout 24 serves to confine a quantity of adhesive 26, typically, either a paste, dry-film or liquid, usually of the thermoset variety, deposited in the cutout. The adhesive 26 placed in the cutout 26 secures the chip 10 to the substrate 12 such that the anisotropically conductive material 18 is maintained in compression, as is desirable.

A major advantage of connecting the chip 10 to the substrate 12 by the combination of the anisotropically conductive material 18 and the adhesive 26 is that the chip can be replaced without damage to the metallized areas 16 on the substrate. Should the chip 10 become defective after attachment to the substrate 12 by the adhesive 26, the chip can be removed by shearing the adhesive bond with the substrate. Since there is no physical bond between the bond sites 14 on the chip 10 and the metallized areas 16 on the substrate 12, removal of the chip causes no damage to the metallized areas, thus greatly facilitating repair.

The foregoing describes a technique for connecting each of a plurality of bond sites 14 on a semiconductor chip 10 to corresponding metallized areas on a substrate 12 via a layer of anisotropically conductive material having at least one cutout 24 therein for receiving a quantity of adhesive which secured the chip to the substrate.

It is to be understood that the above-described embodiments are merely illustrative of the principles of the invention. Various modifications and changes may be made thereto by those skilled in the art which will embody the principles of the invention and fall within the spirit and scope thereof. For example, while the present technique has been described for attaching an unpackaged chip 10, a conventional packaged integrated circuit (not shown) could have each of its leads or conductive pads attached in the same manner.

I claim:

1. A method for interconnecting each of a plurality of conductive members on a component to a corresponding one of a plurality of metallized areas on a substrate comprising the steps of:

placing a non-adhering sheet of anisotropically conductive material, having at least one cutout therein, onto a substrate such that the cutout exposes a portion of the substrate lying between a pair of metallized areas;

filling the cutout in the anisotropically conductive material with an adhesive; and placing a component, having at least one conductive member, onto the anisotropically conductive material such that each conductive member is in aligned registration with a corresponding metallized area and that at least a portion of the component is adhered to the substrate by the adhesive to maintain the anisotropically conductive material in compression.

2. The method according to claim 1 wherein the anisotropically conductive material has a single cutout therein and is placed on the substrate such that the cutout is located centrally with respect to the metallized areas.

3. The method according to claim 1 wherein the component may be removed from the substrate without damage to any of the metallized areas thereon by shearing the adhesive bond between the component and the substrate.

4. An assembly fabricated by the steps of:

placing a non-adhering sheet of anisotropically conductive material, having at least one cutout therein, onto a substrate such that the cutout exposes a portion of the substrate lying between a pair of metallized areas on the substrate;

filling the cutout in the anisotropically conductive material with an adhesive; and placing a component having at least a pair of conductive members onto the anisotropically conductive material such that each conductive member is in aligned registration with a corresponding metallized area on the substrate and that at least a portion of the component is adhered to the substrate by the adhesive to maintain the anisotropically conductive material in compression.

5. The assembly according to claim 4 wherein the anisotropically conductive material has a single cutout therein and is placed on the substrate such that the cutout is located centrally with respect to the metallized areas.

6. The assembly according to claim 4 wherein the component is removable from the substrate without damage to any of the metallized areas thereon by shearing the adhesive bond between the component and the substrate.

7. An assembly comprising:

a substrate having a plurality of metallized areas on a first major surface thereof arranged in a predetermined pattern;

a sheet of anisotropically conductive material overlying the first major surface of the substrate, the material having at least one cutout therein for exposing a portion of the substrate lying between a pair of metallized areas on the first surface thereof;

a quantity of adhesive deposited within the cutout within the anisotropically conductive material;

at least one component having a plurality of conductive members, the component overlying at least a portion of the cutout in the conductive material so as to be in contact with the adhesive, and the component being positioned such that each conductive member thereof is in aligned registration with a corresponding metallized area on the substrate, the component being secured to the substrate by the adhesive so as to maintain the anisotropically conductive material in compression.

8. The assembly according to claim 7 wherein the adhesive comprises a thermoset adhesive.

9. The assembly according to claim 7 wherein the component comprises an unpackaged semiconductor chip.

* * * * *